(12) United States Patent
Willoughby et al.

(10) Patent No.: US 6,878,930 B1
(45) Date of Patent: Apr. 12, 2005

(54) ION AND CHARGED PARTICLE SOURCE FOR PRODUCTION OF THIN FILMS

(76) Inventors: Ross Clark Willoughby, Chem-Space Associates, Inc. 655 William Pitt Way, Pittsburgh, PA (US) 15238; Edward William Sheehan, Chem-Space Associates, Inc. 655 William Pitt Way, Pittsburgh, PA (US) 15238; Carolyn A Fries, 755 19th Ave. North, St. Petersburg, FL (US) 33704

( * ) Notice: Subject to any disclaimer, the term of this patent is extended or adjusted under 35 U.S.C. 154(b) by 0 days.

(21) Appl. No.: 10/785,441

(22) Filed: Feb. 23, 2004

Related U.S. Application Data

(60) Provisional application No. 60/449,644, filed on Feb. 24, 2003.

(51) Int. Cl.$^7$ .......................... H01J 49/10; H01J 37/00
(52) U.S. Cl. ...................... 250/281; 250/282; 250/283; 250/288; 250/396 R; 250/423 R
(58) Field of Search ................................ 250/281, 282, 250/283, 288, 396 R, 423 R

(56) References Cited

U.S. PATENT DOCUMENTS 6,683,301 B1 * 1/2004 Whitehouse et al. ....... 250/288
6,744,041 B1 * 6/2004 Sheehan et al. ............ 250/283
6,784,424 B1 * 8/2004 Willoughby et al. ........ 250/292

* cited by examiner

Primary Examiner—Nikita Wells

(57) ABSTRACT

The present invention includes a delivery means of material to be deposited onto thin film surfaces with precise spatial, temporal, compositional, and energy resolution for controlled reactions, patterning (2-dimensional and 3-dimensional), and removal of materials or reaction products of materials from thin film surfaces. The device includes a near atmospheric pressure means of generating ions, ion clusters, or charged particles as a material form to deliver said materials onto substrate surfaces. The device relies on shaped, patterned, conformal ion lenses, and individually addressable lens elements of a lens arrays to create an integrated deposition system for printed patterns of thin films. The devices and methods provide a novel approach to delivering materials to a surface, removing materials from a surface, or creating new materials at or on the surface. These methods and devices may be used in applications of thin film deposition, micro-electronics and semi-conductor manufacturing, printing, surface interfacial layers, coating, painting, sample and reagent treatment, preparation for sensors, chemical analysis, and fabricating 2- and 3-dimensional structures and devices.

36 Claims, 11 Drawing Sheets

ION AND CHARGED PARTICLE SOURCE FOR PRODUCTION OF THIN FILMS

CROSS-REFERENCE TO RELATED APPLICATIONS

This application is entitled to the benefit of provisional Patent Application Ser. No. 60/449,644, filed 2003 Feb. 24. In addition this application uses the high transmission elements disclosed in our co-pending applications, Ser. No. 09/877,167, filed 2001 Jun. 8, and Ser. No. 10/449,147, filed 2003 May 31.

FEDERALLY SPONSORED RESEARCH

The invention described herein was made in part during the course of work under a grant from the Department of Health and Human Services, Grant Number: 1 R43 RR143396-1.

SEQUENCE LISTING OR PROGEM

Not Applicable.

BACKGROUND OF THE INVENTION

1. Field of the Invention

The present invention relates to devices and methods to deliver thin film materials onto substrates using near atmospheric pressure (or alternatively above atmospheric pressure) generated ions, ion clusters, or charged particles (droplets and/or solid particles) as the material form, or as a precursor to reaction products that are the material form. The technique relies on the use of ion and particle generators in combination with shaped, patterned, conformal ion lenses and individually addressable elements of a lens array to create an integrated deposition system for printed patterns of thin films. The devices and methods provide a novel approach to delivering materials to a surface, removing materials from a surface, or creating new materials at or on the surface. Transport of material to and away from the surface is precisely controlled spatially, temporally, and compositionally. These methods and devices may be used in applications of thin film deposition, micro-electronics and semi-conductor manufacturing, printing, surface interfacial layers, coating, painting, sample and reagent treatment, preparation for sensors, chemical analysis, and 3-dimensional structures and devices as diagramed in FIG. 1.

2. Description of Related Art

The application of inks is well known in the graphic arts, publishing and printing inks industries. A new and emerging area in printing is the ability to print organic electronic devices using complex materials in thin films, rapidly and at atmosphere (1).

Printing materials for graphics arts products typically is through five major routes: offset lithography, letterpress, gravure, screen print and xerography. Printing materials for electronic purposes demands more stringent requirements for contiguous thin film multilayer applications, and has been primarily demonstrated with inkjet technology, photolithographic patterning, stenciling, microcontact printing, or print and etch methods that use artwork and photoprocesses.

The application of organic, inorganic, biomolecular thin films using vacuum based processes is a common practice, however, atmospheric processes for thin film deposition have been of limited practice (2). This citation focuses on the use of electrosprayed ions of biomolecules to create multiple deposits of any size and form through a dielectric mask that covered a slightly conductive substrate.

A comprehensive summary of the classical approaches to ion generation and processing is reviewed in reference (3). Ions are typically generated with one or more plasma or discharge devices that operate at reduced pressure. Ion beam technologies are summarized in reference (4).

In microelectronics, circuit fabrication involves a number of steps carried out primarily under vacuum and sequentially as follows, 1. Epitaxial growth of doped Si or GaAs layers on Si or GaAs substrate
2. Ion implantation of dopants (B an P into Si, Si into GaAs) selective in depth and location. The implant damage must be annealed out.
3. Ion Implantation of non-dopants (e.g. protons) to deliberately cause damage thus lowering the conductivity to provide electrical isolation of devices.
4. Deposition of dielectric layers to isolate the conductive layers.
5. Patterning a mask to define specific features. This usually involves covering the wafer with photosensitive material (resist), exposing it to energy (ultraviolet or x-ray photons, electrons, or ion beams) to change its structure locally so that a pattern can be developed.
6. Etching the pattern in the semiconductor (e.g. GaAs) in one of the dielectric layers (e.g. Si3N4) or in metal film (e.g. Al).
7. Planarization of the surface to allow for the next process step.
8. Deposition of polycrystalline semiconductor, particularly Si, for transistor gates.
9. Cleaning between process steps. There may be 10–12 mask levels each requiring a different process step and a clean surface. Since each mask involves photolithography, removal of residual resist at each stage is vital.

The requirement of each of these steps to be performed under vacuum creates substantial cost and complexity. The present device addresses alternative atmospheric pressure processes that may replace some of the low-pressure processes with cheaper and possibly more precise surface processes.

The generation of ions and charged particles at atmospheric pressure is accomplished by a variety of means; including, electrospray (ES), atmospheric pressure chemical ionization (APCI), atmospheric pressure matrix assisted laser desorption ionization (AP-MALDI), discharge ionization, $^{63}$Ni sources, inductively coupled plasma ionization (ICP), and photoionization. A general characteristic of all atmospheric sources is the dispersive nature of the ions once produced. For example, needle sources such as ES and APCI disperse ions radially from the axis in high electric fields emanating from needle tips. Aerosol techniques disperse ions in the radial flow of gases emanating from tubes and nebulizers. Even desorption techniques such as AP-MALDI will disperse ions in a solid angle from a surface. The radial cross-section of many dispersive sources can be as large as 5 or 10 centimeters in diameter. As a consequence of a wide variety of dispersive processes, efficient sampling of ions from atmospheric pressure sources to small cross-sectional targets or through small cross-sectional apertures and tubes (usually less than 1 mm) into a targeted small region in space becomes quite problematic. This is particularly amplified if the source of ions is removed from the regions directly adjacent to the target surface or transmission aperture. Clearly, there is a need for improvement by optical means of transmitting and controlling ions and charged particles from dispersive sources to deposition surfaces.

Approaches for sampling ions at atmospheric pressure is exampled by the approaches used to interface atmospheric ion sources to mass spectrometers. The simplest approach to sampling dispersive atmospheric sources into vacuum is to position the source on axis with a sampling aperture or tube. The sampling efficiency of simple plate apertures is generally less than 1 ion in $10^4$. A device disclosed in U.S. Pat. No. 4,209,696 to Fite (1980) used pinhole apertures in plates with electrospray. Devices disclosed in U.S. Pat. No. 5,965,884 (1999) and W.O. patent 99/63576 (1999) to Laiko and Burlingame used aperture plates with atmospheric pressure MALDI. Atmospheric pressure sources disclosed in Japanese patents 06060847 A to Kazuaki et al (1992) and 11230957 A to Hiroaki (1998) are also representative of this inefficient approach. This general approach in severely restricted by the need for precise aperture alignment and source positioning and very poor sampling efficiency.

Wide varieties of source configurations utilize conical skimmer apertures in order to improve collection efficiency over planar devices. This approach to focusing ions from atmospheric sources is limited by the acceptance angle of the field generated by the cone. Generally, source position relative to the cone is also critical to performance, although somewhat better than planar apertures. Conical apertures are the primary inlet geometry for commercial ICP mass spectrometers with closely coupled and axially aligned torches. Examples of conical-shaped apertures are prevalent in ES and APCI inlets, for example U.S. Pat. No. 5,756,994 to Bajic (1998); and ICP inlets, U.S. Pat. No. 4,999,492 to Nakagawa (1991). As with planar apertures, source positioning relative to the aperture is critical to performance and collection efficiency is quite low.

One focusing alternative utilizes a plate lens with a large hole in front of an aperture plate or tube for transferring sample into the vacuum system. The aperture plate is generally held at a high potential difference relative to the plate lens. The configuration creates a potential well that penetrates into the source region and has a significant improvement in collection efficiency relative to the plate or cone apertures. This configuration has a clear disadvantage in that the potential well resulting from the field penetration is dependent of ion source position, or potential. High voltage needles can diminish this well. Off-axis sources can affect the shape and collection efficiency of the well. Optimal positions are highly dependent upon both flow (gas and liquid) and voltages. They are reasonable well suited for small volume sources such as nanospray. Larger flow sources become less efficient and problematic. Because this geometry is generally preferential over plates and cones, it is seen in most types of atmospheric source designs. We will call this approach the "Plate-well" design that is reported with apertures in U.S. Pat. No. 4,531,056 to Labowsky et al. (1985), U.S. Pat. No. 5,412,208 to Covey et al. (1995), and U.S. Pat. No. 5,747,799 to Franzen (1998). There are also many Plate-well designs with tubes reported in U.S. Pat. No. 4,542,293 to Fenn et al. (1985), U.S. Pat. No. 5,559,326 to Goodley et al. (1996), and U.S. Pat. No. 6,060,705 to Whitehouse et al. (2000).

Several embodiments of atmospheric pressure sources have incorporated grids in order to control the sampling. U.S. Pat. No. 5,436,446 to Jarrell and Tomany (1995) utilized a grid that reflected lower mass ions into a collection cone and passed large particles through the grid. This modulated system was intended to allow grounded needles and float the grid at high alternating potentials. This device had limitations with duty cycle of ion collection in a modulating field (non-continuous sample introduction) and spatial and positioning restrictions relative to the sampling aperture. U.S. Pat. No. 6,207,954 B1 to Andrien Jr. et al (2001) used grids as counter electrodes for multiple corona discharge sources configured in geometries and at potentials to generated ions of opposite charge and monitor their interactions and reactions. This specialized reaction source was not configured with high field ratios across the grids and was not intended for high transmission and collection, rather for generation of very specific reactant ions. An alternative atmospheric pressure device disclosed in Japanese patent 11288683 A to Yoshiaki (1998) utilized hemispherical grids in the second stage of pressure reduction. Although the approach is similar to the present device in concept, it is severely limited by gas discharge that may occur at low pressures if higher voltages are applied to the electrodes and most of the ions are lost at the cone-aperture from atmospheric pressure into the first pumping stage.

Grids are also commonly utilized for sampling ions from atmospheric ion sources utilized in ion mobility spectrometry (IMS). Generally, for IMS analysis ions are pulsed through grids down a drift tube to a detector as shown in U.S. Pat. No. 6,239,428B1 to Kunz (2001). Great effort is made to create planar plug of ions in order to maximize resolution of components in the mobility spectrum. These devices generally are not continuous, nor do they require focusing at extremely high compression ratios. Our own U.S. patent application Ser. No. 09/877,167 (2001) and Ser. No. 10/449,147 (2003) describes high transmission elements, single layer and laminated, which allow the passage of substantially all of the ions or charged particles from a dispersive source through the element and be deposited as a small cross sectional area on a surface.

In general, prior art in the field of atmospheric optics, particularly that found for applications in mass spectrometry, has not addressed the spatial and temporal control and patterning requirements for applications in thin film deposition and printing.

OBJECTS AND ADVANTAGES

The primary object of the present methods and devices are to have programmable spatial, temporal, and compositional control of the deposition of ions and charge particles onto targeted surfaces so that final the 2- or 3-dimensional surfaces have precise and definable spatial and compositional resolution. The precise control of deposition processes, surface chemistry, material removal, and the sequence of processes are essential for these requirements to be met and are the critical function of the present invention.

One object of the present invention is to increase the collection efficiency of an ions and/or charged particles at a collector surface, or through an aperture or tube into a vacuum system, by creating a precisely controlled cross-sectional area or patterned beam of ions and/or charged particles from highly dispersed atmospheric pressure ion sources. Another object of the present invention is to increase the transmission efficiency of ions from atmospheric pressure ion sources to a target collector, or through an aperture or tube.

The present invention has a significant advantage over prior art in that the use of a wide variety of high transmission element (HTE) configurations to separate the ion or charged particles generation region from the ion focusing allows precise shaping of fields in both regions and selective transmission from on region to the other. Ions can be generated in large ion source regions without losses to walls. Droplets have longer time to evaporate and/or desorb ions without loss from the sampling stream. Source temperatures can be lower because rapid evaporation and desorption rates are not as critical. This can prevent thermal decomposition of some labile compounds of particular importance to thermal labile vapor deposition compounds used in CVD. Counter electrodes for electrospray needles do not have to be the plate lens as practiced with most conventional sources. An aerosol or ion population can be generated remotely and ions can be allowed to drift toward the HTE.

Another object of the present invention is to have collection efficiency be independent of ion source position relative to the collection well. With the present invention, there is no need for precise mechanical needle alignment or positioning relative to collection surfaces, conductance apertures, or conductance tubes. Ions generated at any position in the ion source region may be transmitted to the collector, aperture, or tube with similar efficiency. No existing technology has positional and potential independence of the source. The precise and constant geometry and alignment of the focused beams with sampling apertures will not change with needle placement. The fields in the optics region (focusing side of HTE) will not change, even if they change in the source region.

Another object of the present invention is the independence of ion or charged particle source type. This device is capable of transmission and collection of ions from any atmospheric (or near atmospheric) source; including but not limited to, electrospray, atmospheric pressure chemical ionization, atmospheric pressure MALDI (laser desorption), inductively coupled plasma, discharge sources, nickel 63 sources, spray ionization sources, induction ionization sources and photoionization sources plasma sources, PVD, and CVD. The device is also capable of sampling ions or charged particles of only one polarity at a time, but with extremely high efficiency. However, the device is capable of operation with any charge polarity or number of charges per ion or particle.

Another object of the present invention is to efficiently collect and/or divert a flow of ions or charged particles from more than one source or from a blanket ion spray. This can be performed in a parallel fashion for introduction of multiple materials from separate sources. The transmission and collection of ions from different sources can be performed sequentially as is typical with multiplexing of multiple sprayers or ionizers.

Another object of the present invention is to efficiently transmit ions to more than one target position. This would have the utility of allowing part of the sample to be collected on one surface while another part of the sample is being introduced to another surface. In high-speed printing or deposition applications, the ability to simultaneously direct portion of material to more than one surface increases efficiency, flexibility, and speed of the process. A wide variety of processes including deposition, reactions (e.g. chemical, photo), material removal, neutralization, heating, evaporation, melting, and adsorption, can occur on a given target position by directing a beam to a specific location at a given time. The target surfaces can be spatially separated relative to the ion or particle beams by changing the beam positions relative to the surface. The target surfaces can also be temporally separated relative to the ion or particle beams by changing the composition in time.

Additional energy and material can be added to the surface deposited materials by adding light (e.g. lasers), heat, other ion beams, and other reactants (e.g gaseous or liquid) that are required to affect a desirable final surface composition. This energy and material can be added remotely by moving the material deposited target surface to a remote location relative to the ion or particle beam. This energy and material can be added sequentially the desired additional energy or material to the target surface location in a sequential fashion.

Another object of the present invention is to improve the efficiency of multiplexed inlets from both multiple macroscopic sources and micro-chip arrays, particularly those developed with multiple needle arrays for electrospray. Position independence of this invention makes it compatible with a wide variety of needle and sprayer array technologies. Sampling arrays into the present optical devices will allow increased complexity in terms of number of different materials being delivered to a target surface. Dozens of reagents or reactants can be individually delivered to the surface in precise fashion from small and isolated reservoirs.

Another object of the present invention is to remove larger droplets and particles from aerosol sources with a counter-flow of gas to prevent contamination of critical surfaces with unwanted particles. This is of value when the deposition material is intended to be gas-phase ions removed from aerosol sources.

Another object of the present invention is to remove ions and unwanted neutral gases from aerosol sources with a counter-flow of gas to prevent contamination of apertures, tubes, and vacuum components. This is of value when the deposition material is intended to be charged droplets or particles from aerosol sources.

SUMMARY

A preferred embodiment of the present invention includes a delivery means of material to be deposited onto thin film surfaces with precise spatial, temporal, and compositional, and energy resolution for controlled reactions, patterning (2-dimensional and 3-dimensional), and removal of materials or reaction products of materials from thin film surfaces. The device includes a near atmospheric pressure means of generating ions, ion clusters, or charged particles as a material form to deliver said materials onto substrate surfaces. The device relies on shaped, patterned, conformal ion lenses, and individually addressable lens elements of a lens arrays to create an integrated deposition system for printed patterns of thin films. The devices and methods provide a novel approach to delivering materials to a surface, removing materials from a surface, or creating new materials at or on the surface.

These methods and devices may be used in applications of thin film deposition, micro-electronics and semi-conductor manufacturing, printing, surface interfacial layers, coating, painting, sample and reagent treatment, preparation for sensors, chemical analysis, and fabricating 2- and 3-dimensional structures and devices as diagramed in FIG. 1.

The physical separation of the ion or charge particle source region from the deep potential-well focusing region by a high transmission element (HTE) solves many of the efficiency problems associated with conventional approaches to ion collection at atmospheric pressure. With the present invention, dispersed ions can be focused to a small diameter in a remote focusing region; rather, they are allowed to drift toward a relatively large front surface of the HTE before being attracted into the focusing region. In this way, appreciably all ions from a given source can be collected across an appropriately sized and shaped HTE surface, then focused in the high field of the focusing region.

REFERENCES (1) Advanced Technology Workshop on Printing an Intelligent Future, D. Gomata, B. Ong, J. Zhang,—chairs, IMAPS, Lake Tahoe Nev., 2002
(2) Electrospray Deposition as a Method for Mass Fabrication of Mono- and Multicomponent Microarrays of Biological and Biologically Active Substances, Analytical Chemistry, 1999, 71, pp 3110–3117
(3) Rossnagel, Cuomo, and Westwood, Handbook of Plasma Processing: Fundamentals, Etching, Deposition, and Surface Interactions, Noyes Publications, Park Ridge (1990).
(4) Cuomo, Rossnagel, and Kaufman, Handbook of Ion Beam Processing Technology; Principles, Deposition, Film Modification, and Synthesis, Noyes Publications, Park Ridge (1989).
(5) Tolliver, Handbook of Contamination Control in Microelectronics; Principles, Applications, and Technology, Noyes Publications, Park Ridge (1988).

DRAWINGS—FIGURES

In the drawings, closely related figures have the same number but different alphabetic suffixes.

Figure 4A:
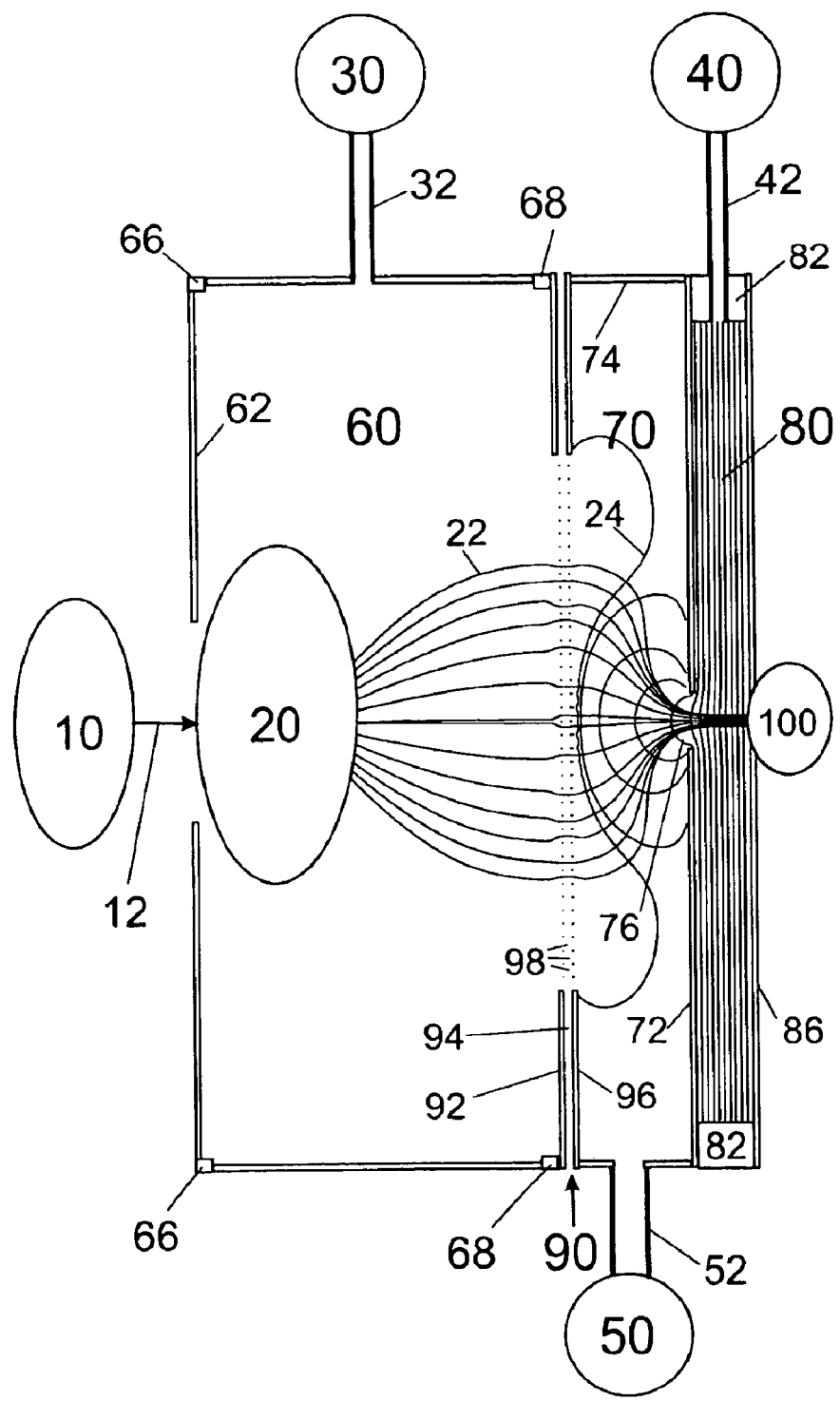
Figure 4B:
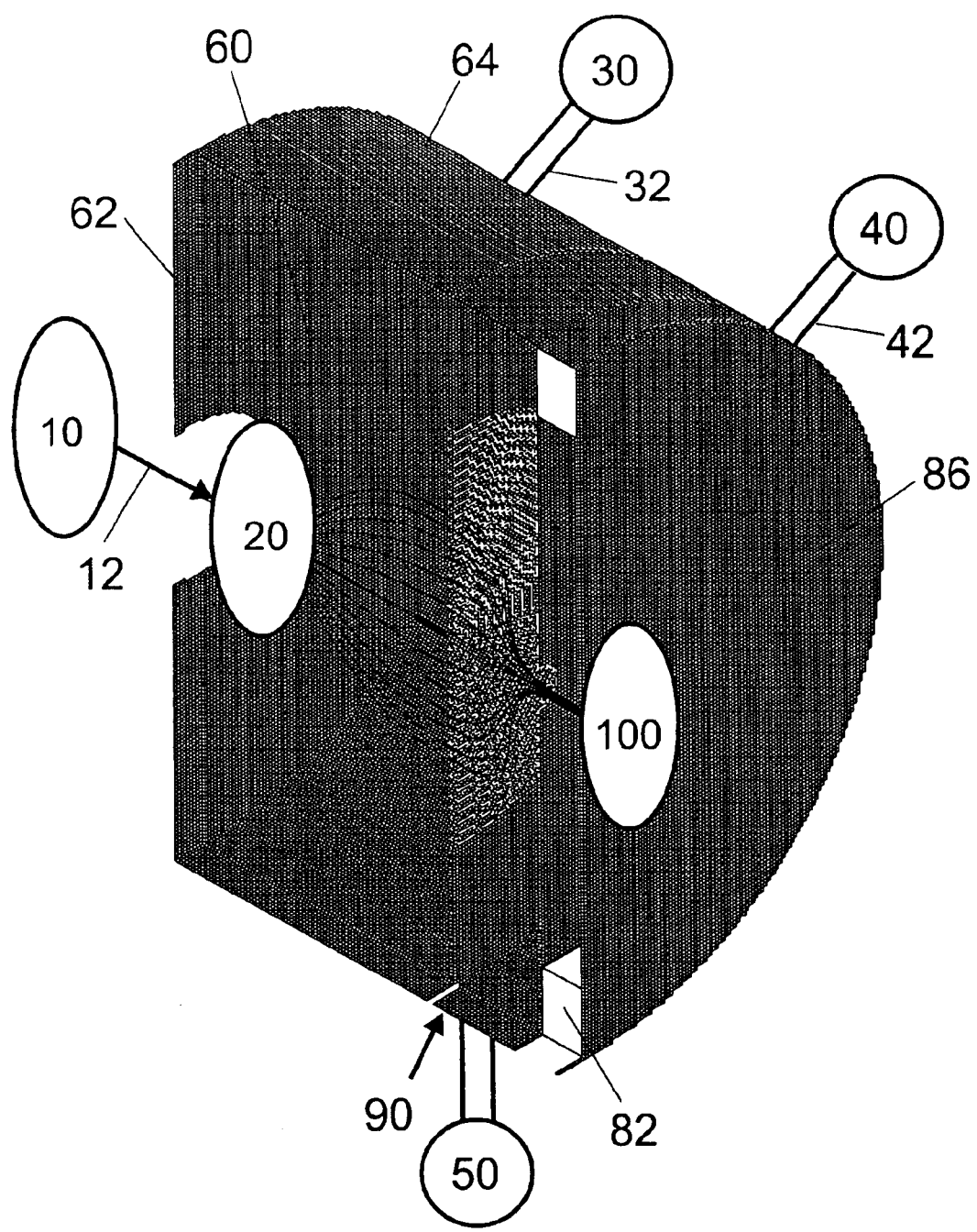
Figure 4C:
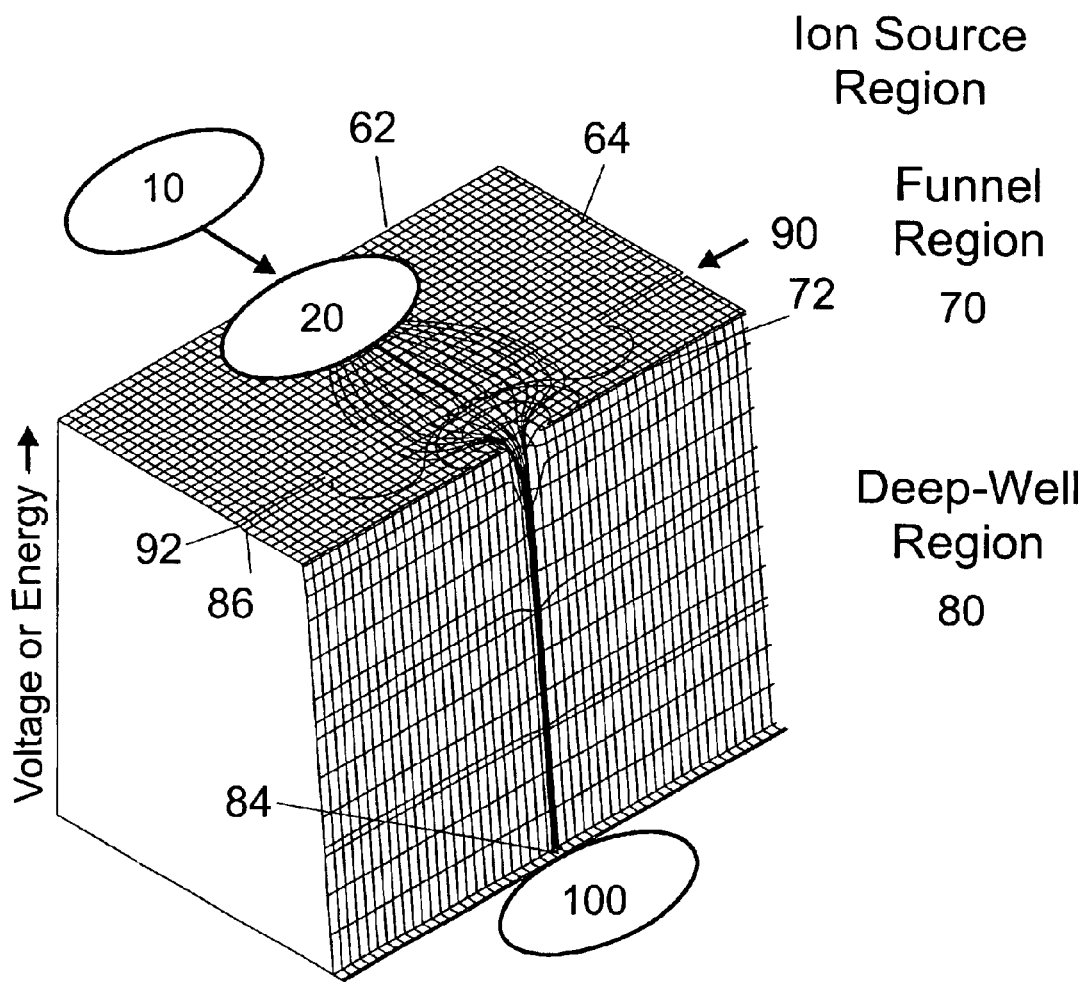

FIGS. 4A to 4C illustrates a preferred embodiment of the current invention showing electrospray ionization, transmission across the HTE into the funnel well optics, and deposition of a continuous ion beam onto a movable surface (Ion drawing mode). The computer modeled ion trajectories are shown to illustrate ion motion under typical fields at atmospheric pressure: (A) Illustrates a preferred embodiment shown in a cross-section drawing, (B) in a 3-dimensional cutaway perspective, and (C) the device in A and B graphed as a potential energy surface to show the motion of the ions in typical applied voltages on the various components of the device.

FIGS. 5A to 5F shows various means of manipulating the beam relative to the target surface for: (A) roll-feeding the target surface, (B) sheet feeding the target surface, (C) belt feeding the target objects, (D) mechanical control with translation of target relative to a fixed beam assembly, (E) mechanical control with translation of the beam assembly relative to a fixed target position, and (F) movement of the ion beam relative to the target by mechanically moving the funnel lens aperture relative to the target.

FIGS. 6A to 6F shows some deposition processes that may occur during various operating modes of the invention: (A) oxidation or reduction of ions or particle materials on the surface of a conductor, (B) oxidation or reduction of ions or particle particles on the surface of a dielectric, (C) accumulation of ions or charged particles on the surface of a dielectric, with local neutralization or chemical reaction by addition of reagents, (D) interaction with ions or charged particles with laser or other light to facilitate reduction or other photo induced chemical processes, (E) accumulation of ions or charged particles on the surface, with remote neutralization or chemical reaction, and (F) melting of applied materials onto surface.

Figure 7:
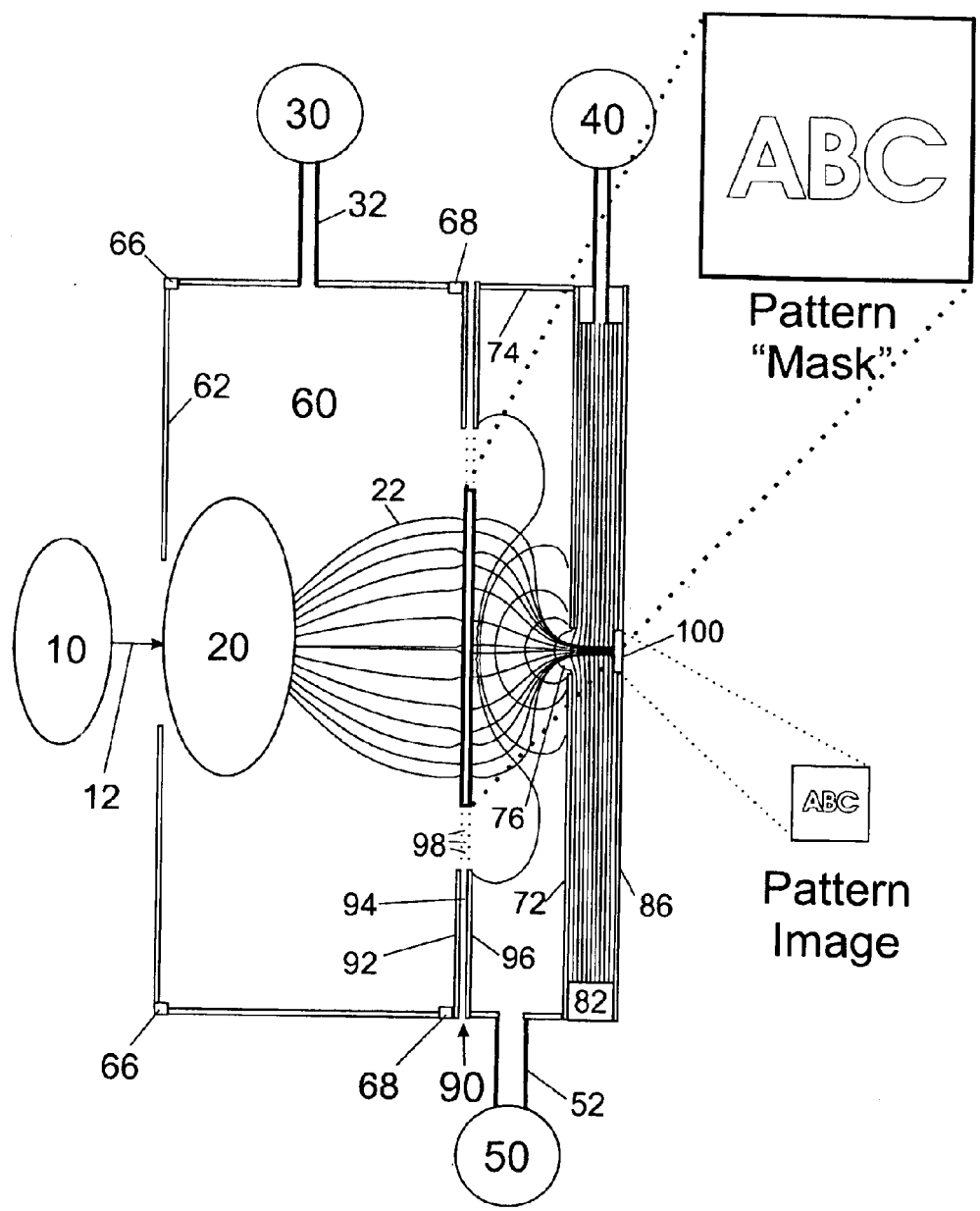

FIG. 7 illustrates an alternative preferred embodiment of the current invention showing electrospray ionization, transmission across the masked HTE into the funnel well optics, and deposition of ion beam onto a static surface (Ion patterning mode). The computer modeled ion trajectories are shown to illustrate ion motion under typical fields at atmospheric pressure. Note that multiple sources and masks can be applied in parallel or in series to create complex 2-dimensional and 3-dimensional surfaces with precise positional and compositional discrimination.

Figure 8:
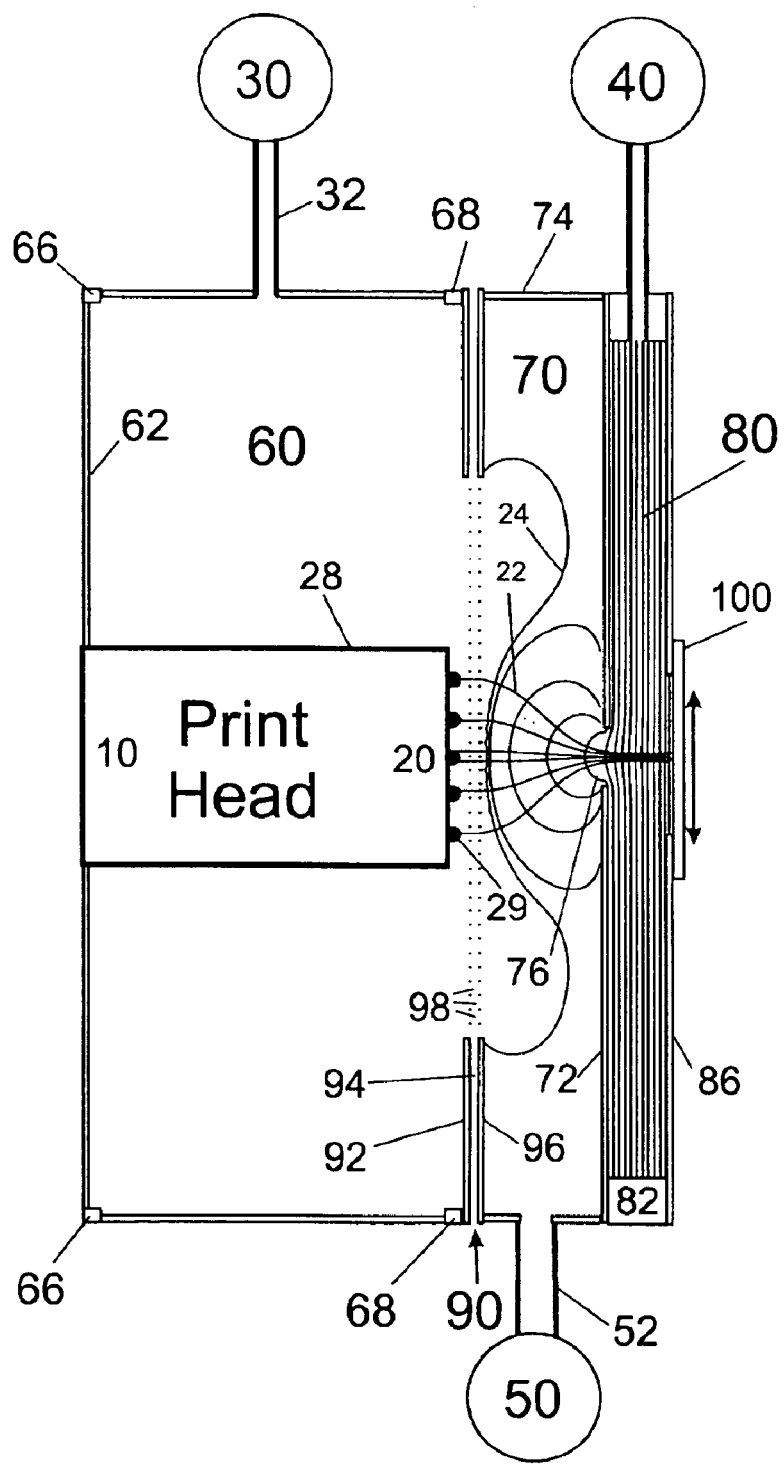

FIG. 8 illustrates an alternative preferred embodiment of the current invention showing discrete pulsed droplet generation (ink-jet head), transmission across HTE into the funnel well optics, and deposition of droplet beam onto a moving surface (Droplet printing mode). The computer modeled droplet trajectories are shown to illustrate ion motion under typical fields at atmospheric pressure.

Figure 9:
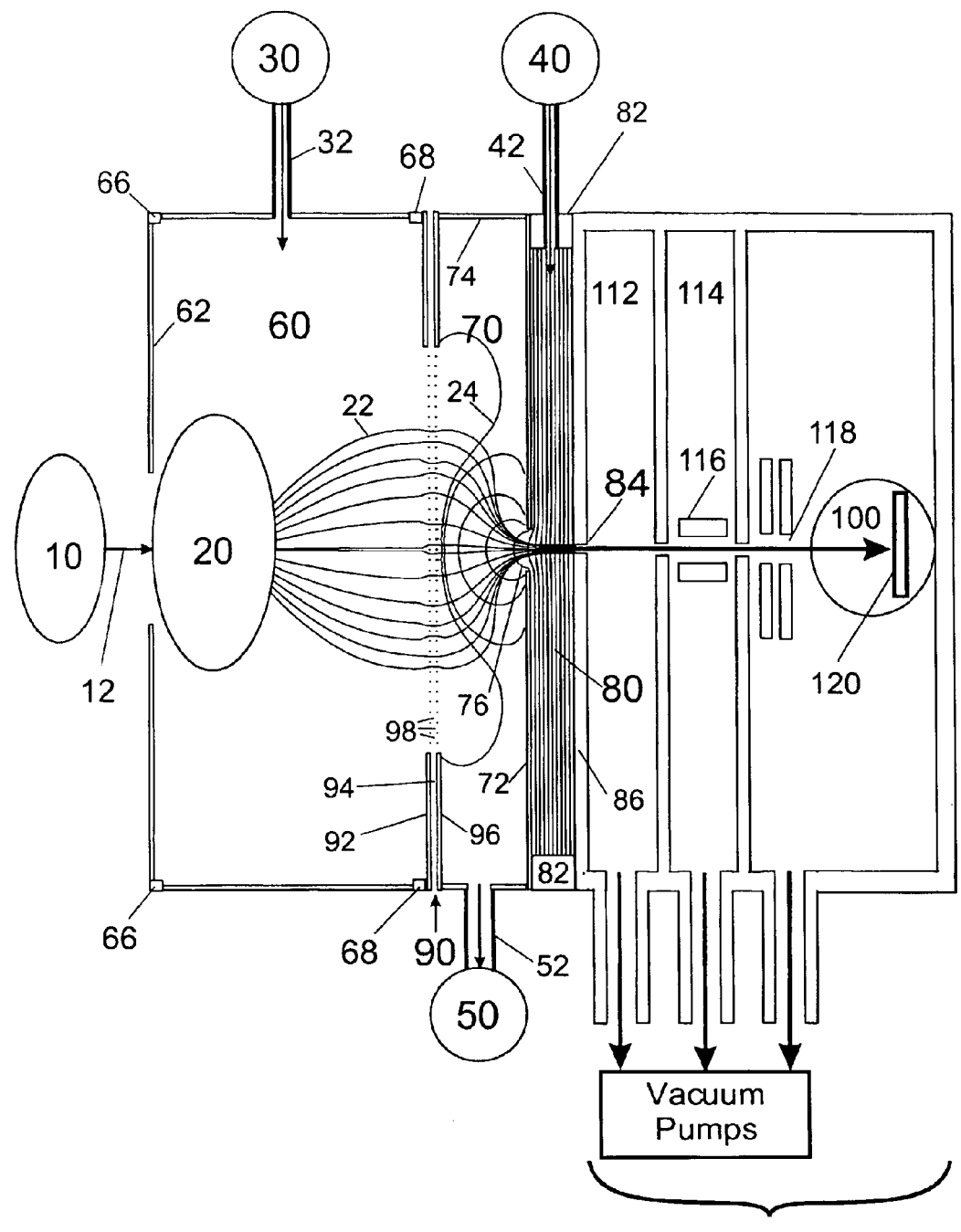

FIG. 9 illustrates an alternative embodiment of the current invention showing a plasma ionization source at atmospheric pressure, transmission across the HTE into the funnel well optics, and efficient transmission of the low energy ion beam into a vacuum system as an alternative (point) source for ions at low pressure for etching, doping, cleaning, reaction chemistry and other operations that may be required under vacuum conditions. The computer modeled ion trajectories are shown to illustrate ion motion under typical fields at atmospheric pressure.

REFERENCE NUMBERS IN DRAWINGS

| | |
|---|---|
| 10 | sample source |
| 12 | sample delivery means |
| 14 | laser source |
| 16 | incident laser beam |
| 18 | reagent supply |
| 20 | ion source |
| 22 | ion trajectories |
| 24 | equipotential lines |
| 26 | needle electrode |
| 28 | ink jet head |
| 29 | droplet array |
| 30 | concurrent gas source |
| 32 | concurrent gas inlet |
| 40 | countercurrent gas source |
| 42 | countercurrent gas inlet |
| 50 | exhaust destination |
| 52 | exhaust outlet |
| 60 | ion source region |
| 62 | ion source entrance wall |
| 63 | window |
| 64 | ion source cylindrical wall |
| 66 | insulator ring |
| 68 | insulator ring |
| 70 | funnel region |
| 72 | funnel lens |
| 74 | funnel region wall |
| 76 | funnel aperture |
| 80 | deep-well region |
| 82 | deep-well ring insulator |
| 84 | exit aperture |
| 86 | exit wall |
| 90 | high transmission element (HTF) |
| 92 | inner-electrode |

| | |
|---|---|
| 94 | HTE insulation layer |
| 96 | outer-electrode |
| 98 | laminate openings |
| 100 | ion destination region |
| 110 | pressure reduction region |
| 112 | 1st stage of pressure reduction |
| 114 | 2nd stage of pressure reduction |
| 116 | ion guide |
| 118 | low pressure ion optics (acceleration) |
| 120 | fow pressure target |

DESCRIPTION OF THE INVENTION—GENERAL

The present invention describes a variety of electro-optical devices and the associated methods of delivering materials to a target surface with precise control over position, composition, and time of deposition. The invention is constructed as to provide both a continuous, or discontinuous supply of ions or charged particles for deposition in desired patterns onto target surfaces. The lens elements may be constructed of predetermined mask patterns of composite construction in 3-dimensional conformations to yield maximum ion directing efficiency and fine directed beam resolution for fine resolution patterning of materials. Alternately, the lens may be a simple, non-conformal 2-dimensional or 3-dimensional shadow mask that imparts its pattern upon the directed, collimated ion beam to yield a structured pattern of deposits toward the substrate. Lastly, the ion stream may be controlled by a lens element array (2-dimensional or 3-dimensional conformal architecture) constructed from switchable elements permitting a "maskless" adaptive lens device such that patterns can be continually or routinely varied depending on the desired pattern to deposit. The lens element array, or digital ion lens is an adaptive design of ion lens elements from the connections between conducting "pads" where the pads are simple conducting through-holes structures. Each metallic through-hole guide element is controlled by a control element and micro-switch to engage or disengage potential to the through hole element and thus affect the ion guiding capability of the element. The global pattern of the entire lens may be changed to create different patterns of connecting pads and thus different lens forms. The lens can be considered a digital ion lens device. It permits the adaptive optimization of ion lens patterns and efficiency, while permitting steering of patterns from a single feed aperture. It may permit the controller/user to trade gain for bandwidth or resolution in printing ion patterns. A key feature that may be incorporated into the transport element is that the potential applied may be of a continuum of values creating a gradient of intensity allowing a gray scale of deposits that may be of utility for variable height deposits and variable density deposits. The configurable ion optical lens or other type of mask element imprints the pattern onto the primary ion beam creating structured patterns of thin film deposits onto the target surface which can be either sheet fed or a roll-to-roll web fed rotary press style print environment. The digital ion lens can be controlled be the computer controller and yielding a "maskless" direct computer to print capability.

Figure 1:
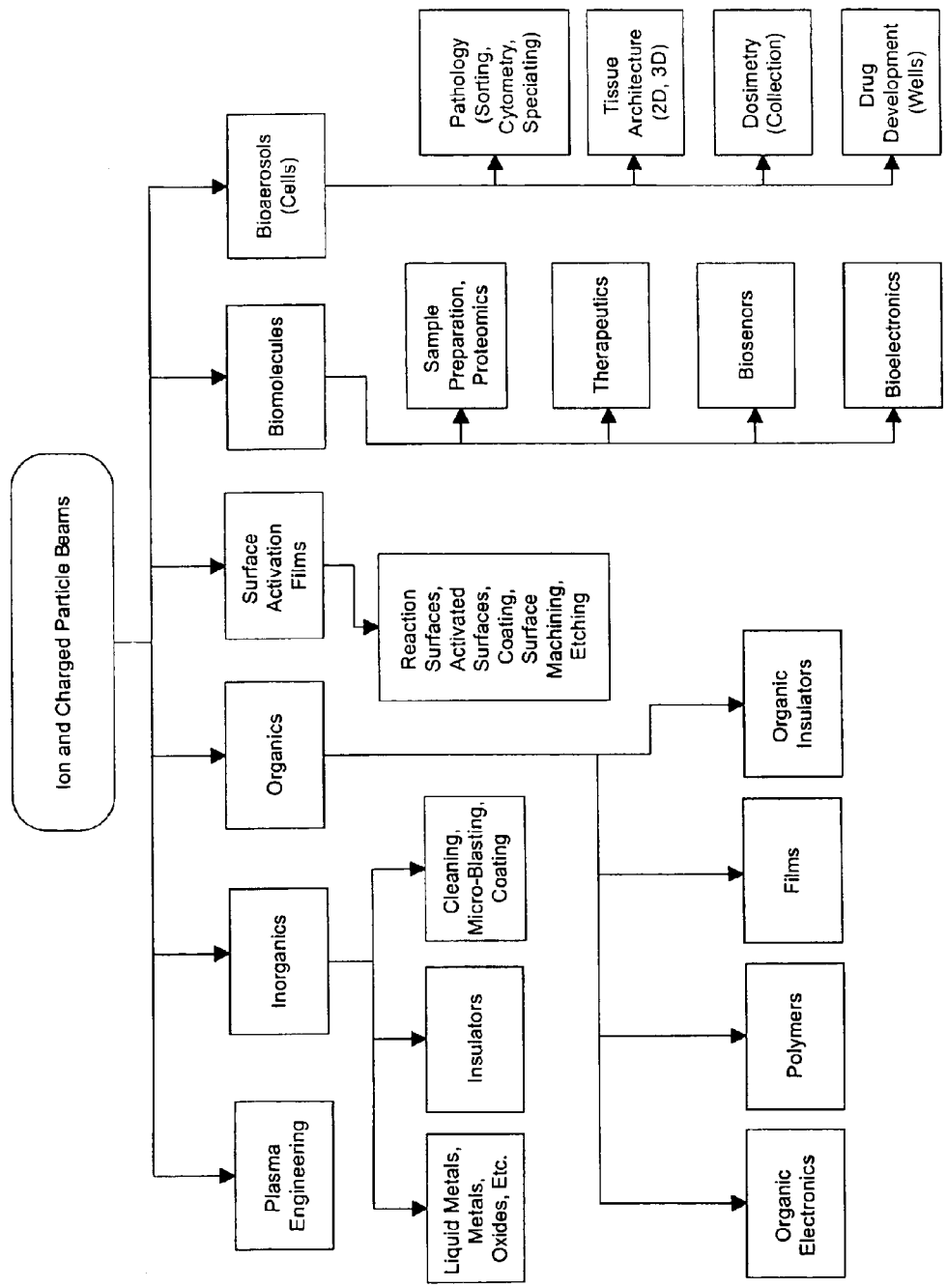
FIG. 1 shows a diagram of the general method applications space of the current invention with respect to material and surface type.

FIG. 1 illustrates the wide variety of materials that are capable of ionization or charging in order to be transported with the current device. Any material that can be transported into the gas phase or aerosol state by an ionization or charged particle generation process is capable of being transported and focused by the current device. These include, but are not limited to, inks, solutions of inorganic and organic materials, polymers, liquid metals, biopolymers, reaction products from plasma sources, and suspensions of cells.

We envision that ionization or charged aerosol generation processes utilized to create ions and/or charged particles are, but not limited to, electrospray (ES) processes, induction processes, atmospheric pressure chemical ionization, plasma ionization, laser and photo-ionization, desorption and sputtering techniques, and thermal ionization. We envision that materials can be sampled into this device from self-contained reservoirs or from external sources, natural or man-made.

The source of ions and/or charged particles can be continuous or pulsed. Electrospray ionization illustrated in FIG. 4 shows how a continuous source of ions can be introduced onto a target surface. Alternatively, discrete droplets that are digitally controlled and emitted from an ink jet head can also be employed (FIG. 8).

There are several general modes of operation with the current device; namely, (1) operating the entire device at or near atmospheric pressure (AP) (FIGS. 2 and 5), (2) operating the source at above atmospheric pressure, while holding the target at atmospheric pressure, (3) operating the source atmospheric pressure while holding the target in high vacuum (FIG. 3), and operating the source at above atmospheric pressure while holding the optics at atmospheric pressure and holding the target at high vacuum (FIG. 9). The general application of atmospheric pressure targets is for low energy deposition. The general application of high vacuum targets is for high-energy deposition.

DETAILED DESCRIPTION

FIGS. 2, 4, 5, and 6—Preferred Embodiment (Low Energy-Atmospheric Pressure Ionization, Electrospray)

Figure 2:
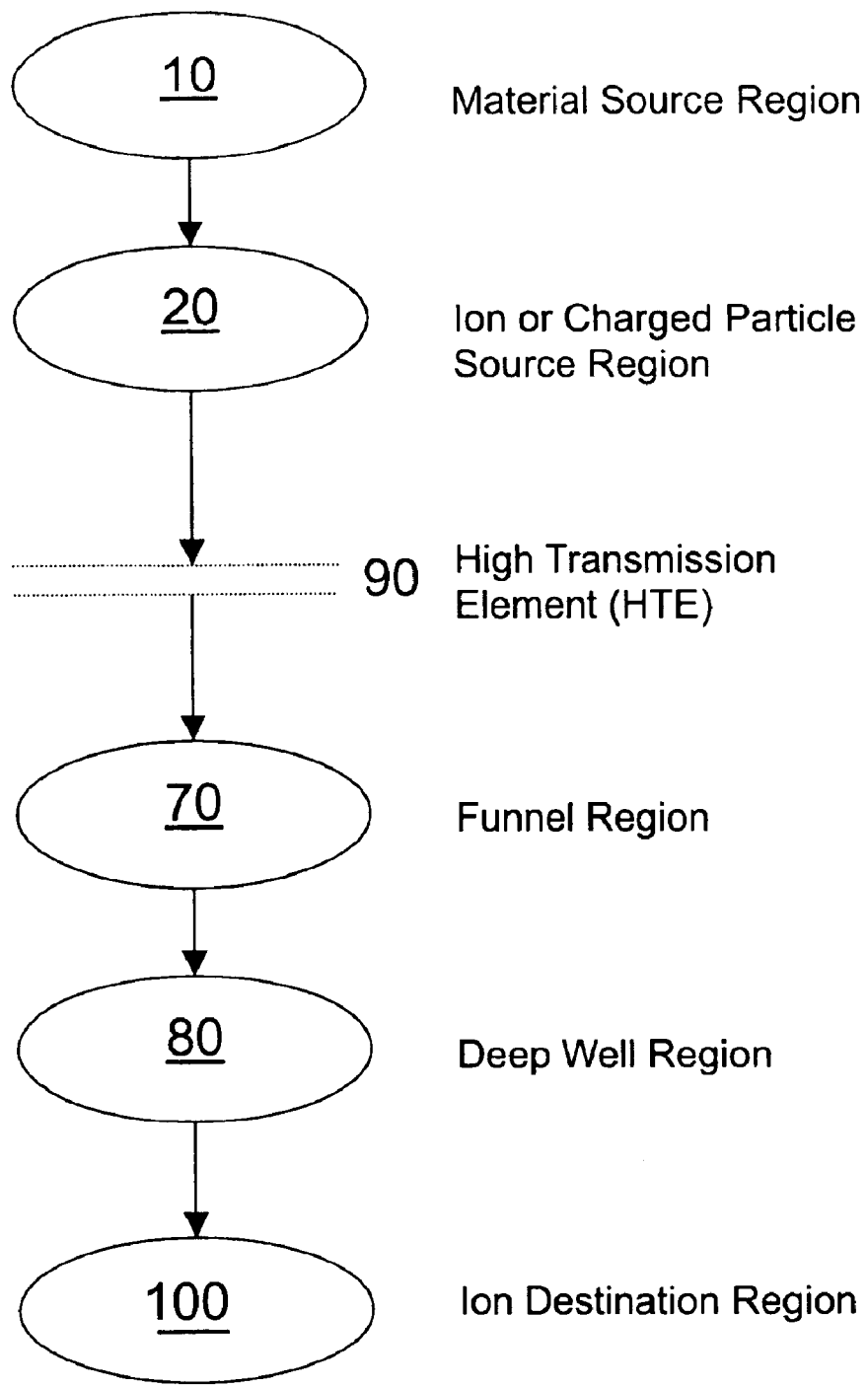
FIG. 2 shows an illustration of the operating regions of the current invention and the processes associated with each for atmospheric pressure ion or particle generation with atmospheric pressure deposition (generally low energy deposition).

A preferred embodiment of the present invention is illustrated generally in FIG. 2 and specifically in FIG. 4. In FIG. 2, materials as discussed above transported from a material source region 10 to the ion source region 20 by a variety of appropriate and conventional transport means including tubes and pumps for liquids, tubes and regulated sweep gas for aerosols, etc. Ions and charged particles are generated in region 20 by discharge, high field, photo-excitation, chemical reaction, or other means. Region 20 is generally held so that a potential difference exists between the location of ionized material and the High Transmission Element (HTE) 90. For this application, HTE will refer to a variety of single or multi-layer conducting surfaces that exist to facilitate the transmission of all or part of the ionized material from the ionization region 20 to the funnel region 70.

Several important implementations of the HTE 90 are described and illustrated in some detail in co-pending applications (U.S. Ser. No. 09/877,167, U.S. PPA 60/384,869, counter-current/con-concurrent (no # yet), trap surface (no # yet)). The present invention may incorporation one or more of this art, as well as including new implementations of the high transmission surface that serve as patterning masks to allow the projection of a pre-defined ion image onto the target surface.

Ions and charged particles that move into the funnel region 70 will be focused into the deep well region 80 as described in co-pending applications (U.S. Ser. No. 09/877, 167, U.S. PPA 60/384,869). A well-collimated beam of ions will be directed at the ion destination region 100.

A specific implementation of a preferred embodiment is illustrated in FIG. 4. This ion or particle transmission and focusing device utilizes a laminated high transmission element 90, abbreviated as HTE 90. Sample from a source 10 is delivered to an ion source 20 by a delivery means 12 through an ion source entrance wall 62. Wall 62 is electrically isolated from an ion source cylindrical wall 64 by a ring insulator 66. Wall 64 is isolated from the HTE 90 by a ring insulator 68. The device includes an atmospheric pressure or near atmospheric pressure ion source region 60 from which ions originating from the source 10 are delivered or, alternatively, neutral species are ionized in the ion source 20. This device is intended for use in collection and focusing of ions from a wide variety of ion sources; including, but not limited to electrospray, atmospheric pressure chemical ionization, photo-ionization, electron ionization, laser desorption (including matrix assisted), inductively coupled plasma, discharge ionization, charged aerosols and ions sampled from nature, etc. Alternatively, the ions or charged particle may be supplied by separating or focusing devices; including, but not limited to ion mobility spectrometers.

Downstream of the ion source region 60 is the HTE 90, composed of laminations comprising inner 92 and outer 96 laminates, surfaces, or electrodes, both conducting separated by an insulator layer or base 94. The surface of the HTE 90 is populated with a multitude of lamination openings or apertures 98 through which ions are transmitted from the ion source region 60 to funnel region 70 which is downstream of the HTE 90. Funnel region 70 is bounded by a funnel region wall 74 and a funnel region lens 72. A DC potential is applied to each laminate, electrode, wall, or lens creating an electric field (indicated by equipotential lines 24), although a single power supply in conjunction with a resistor chain can also be used, to create the desired net motion of ions, as shown by the generalized ion trajectories 22, from the ion source region 60, through the openings 98 of the HTE 90, into region 70, through a funnel lens aperture 76 into a deep-well region 80 where they are accelerated toward the ion destination region 100. Region 100 is comprised of Exit wall 86 isolated from the funnel lens 72 by a deep-well ring insulator 82. Exit wall 86 is made of a conducting material or a conductively coated insulating material such as glass.

Gases, such as but not limited to air or nitrogen can be added to the ion source region 60 for concurrent flow gas from a concurrent gas source 30 introduced through a concurrent gas inlet 32. Gas can also be added for countercurrent flow from a countercurrent gas source 40 through a countercurrent gas inlet 42. Excess gas can be exhausted through an exhaust outlet 52 toward an exhaust destination 50. All gas supplies can be regulated and metered and of adequate purity to meet the needs of the ion transmission application.

All components of the device are generally made of chemically inert materials. In the preferred embodiment, the HTE insulator base 94 is an insulating material, such as glass or ceramic. However, it can consist of any other material that can isolate electrically the two metal electrodes 92 and 96 from each other, such as nylon, polyimide, Teflon, poly ether ether ketone (PEEK), etc. The metal electrodes, 92 and 96, are composed of conductive materials, such as stainless steel, brass, copper, gold, and aluminum. In this embodiment the HTE 90 consists of planar-shaped laminated electrodes 92, 96 of uniform cross-section with circular-shaped openings 98 evenly spaced across the HTE 90. Two perforated plates separated by an insulated layer are workable for the planar geometry, but for other shapes or geometries it is also possible to use molded materials for the base 94 and laminates 92, 96, with the laminates consisting of material that is conducting or as non-conducting molded materials with subsequent deposition of conducting material on the surfaces of the laminates. Alternatively, the metal laminates may be deposited on the base 94 by vapor deposition and the holes or apertures formed by ablating away the metal and base using a laser, or the HTE may be manufactured by using the techniques of microelectronics fabrication: photolithography for creating patterns, etching for removing material, deposition for coating the surfaces with specific materials, etc.

Figure 5:
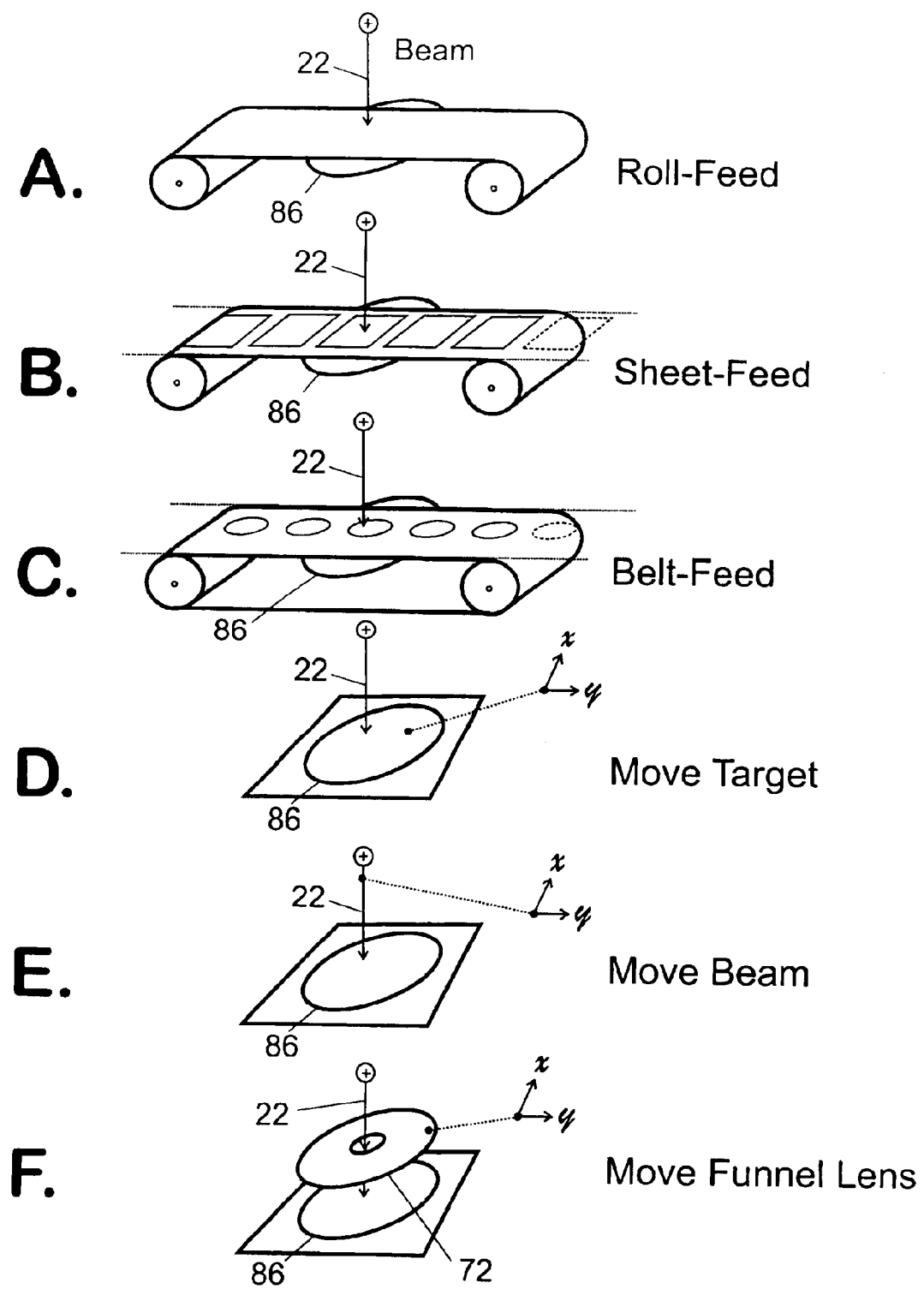

FIG. 5 illustrates the variety of alternative methods for moving the ion or particle beam relative to the target surface. These methods include, but are not limited to, A) roll-feeding the target surface, B) sheet feeding the target surface, C) belt feeding the target objects, D) mechanical control with translation of target relative to a fixed beam assembly, E) mechanical control with translation of the beam assembly relative to a fixed target position, and F) movement of the ion beam relative to the target by mechanically moving the funnel lens aperture relative to the target. All methods of target positioning relative to the beam are required to maintain the integrity of the electric fields that dominate the motion of the ions or charged particles. In some implementations of this invention sources are held at thousands (or even 10s-of-thousands) of volts relative to the target surfaces. Insulators of sufficient size must be utilized to maintain the high potential differences. In some applications, it is easier to maintain the target surface near ground potential, while floating the source; while in other applications, floating the target is required. Precise translation of the target surface material (deposition surface) relative to the ion or charge beams is essential to precise control of spatial resolution of processes and material on the surface.

Figure 6:
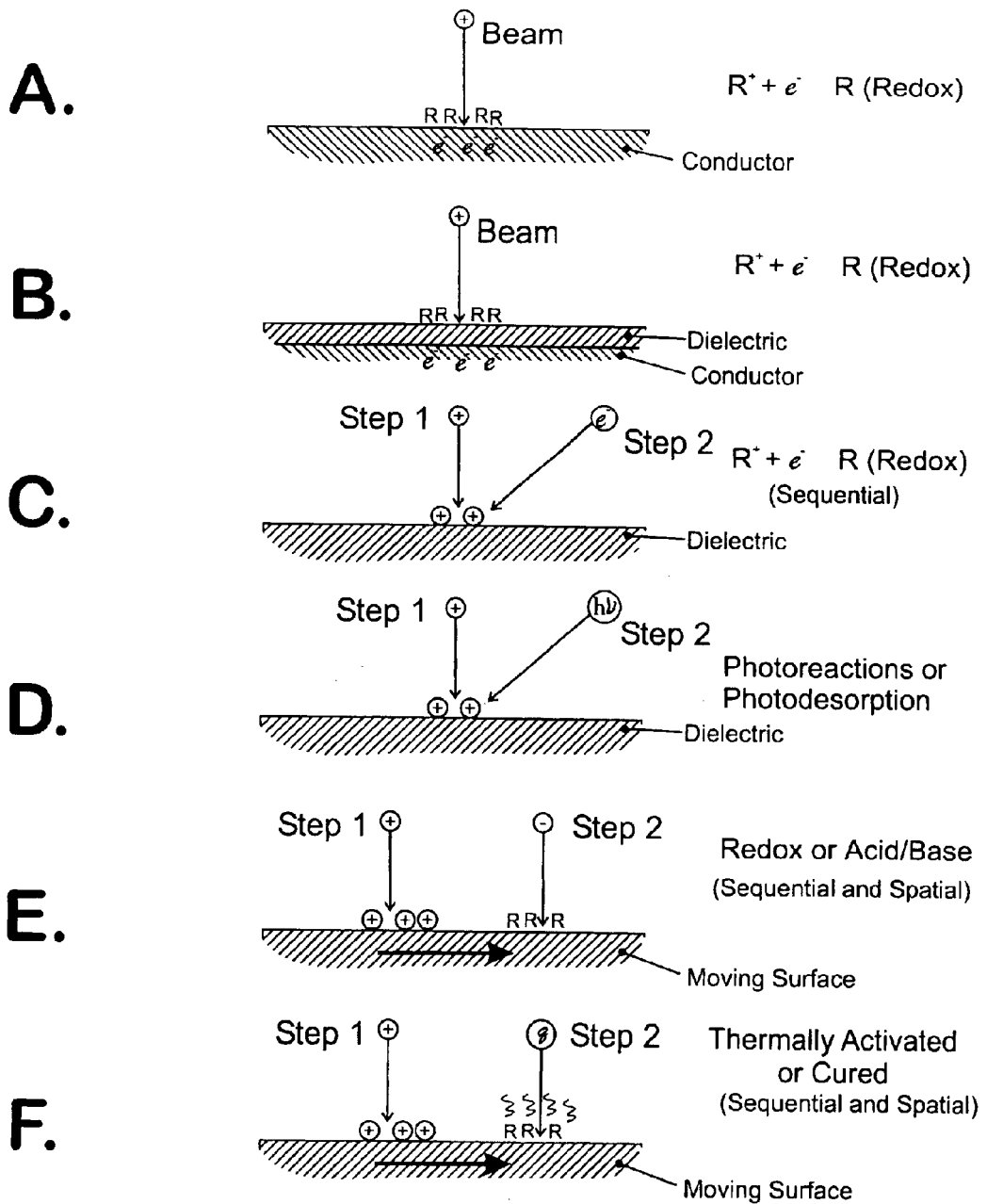

FIG. 6 illustrates examples of processes that occur on the surface of the target. The collimated beam of ions or particles of selected polarity are directed at the deposition surface. When the surface is a conductor, redox processes occur spontaneously at the electric potentials of the operating device. Deposition processes that may occur during various operating modes of the invention, include, A) oxidation or reduction of ions or particle materials on the surface of a conductor, B) oxidation or reduction of ions or particle particles on the surface of a dielectric, C) accumulation of ions or charged particles on the surface of a dielectric, with local neutralization or chemical reaction by addition of reagents, D) interaction with ions or charged particles with laser or other light to facilitate reduction or other photo induced chemical processes, E) accumulation of ions or charged particles on the surface, with remote neutralization or chemical reaction, and F) melting or curing of applied materials on surface. A wide variety of products may result from the aforementioned processes. By varying the specific process (input of reactants and energy), the composition of the surface materials can be precisely controlled in space, time, and composition.

FIGS. 7 Thru 8—Additional Embodiments [Ion Printing Mode of Operation]

Additional embodiments are shown in FIG. 7, in one case the HTE consists of a pattern mask that determines the pattern of ions transmitted across the HTE into the optics region. In an alternative patterning embodiment (not shown) individual transmission elements can be addressed in the HTE as described in co-pending patent application U.S. Ser. No. 10/449,147. The pattern produce by selective transmission across the HTE is then compressed by the compression optics to a reduced and optically consistent cross-sectional pattern of ions to be delivered to the target the target surface.

The final cross-sectional distribution of ions or charged particles onto the deposition surface is a combination of the actual pattern geometry from the HTE and the optical compression geometry that is a function of optics lens geometries and spacing, and the field ratios between elements of the optics region.

One additional embodiment is illustrated in FIG. 8 showing an inkjet-type head 28 generating droplet array 29 introducing charged droplets into the funnel/well region for compression onto a target. Arrays of charged droplets can be evaporated and compressed onto small target cross-sections for micro-printing applications. Heating means may be added to the source region to facilitate evaporation of droplets. Heat can also be added to the source region by remotely heating the countercurrent or concurrent gas lines.

Figure 3:
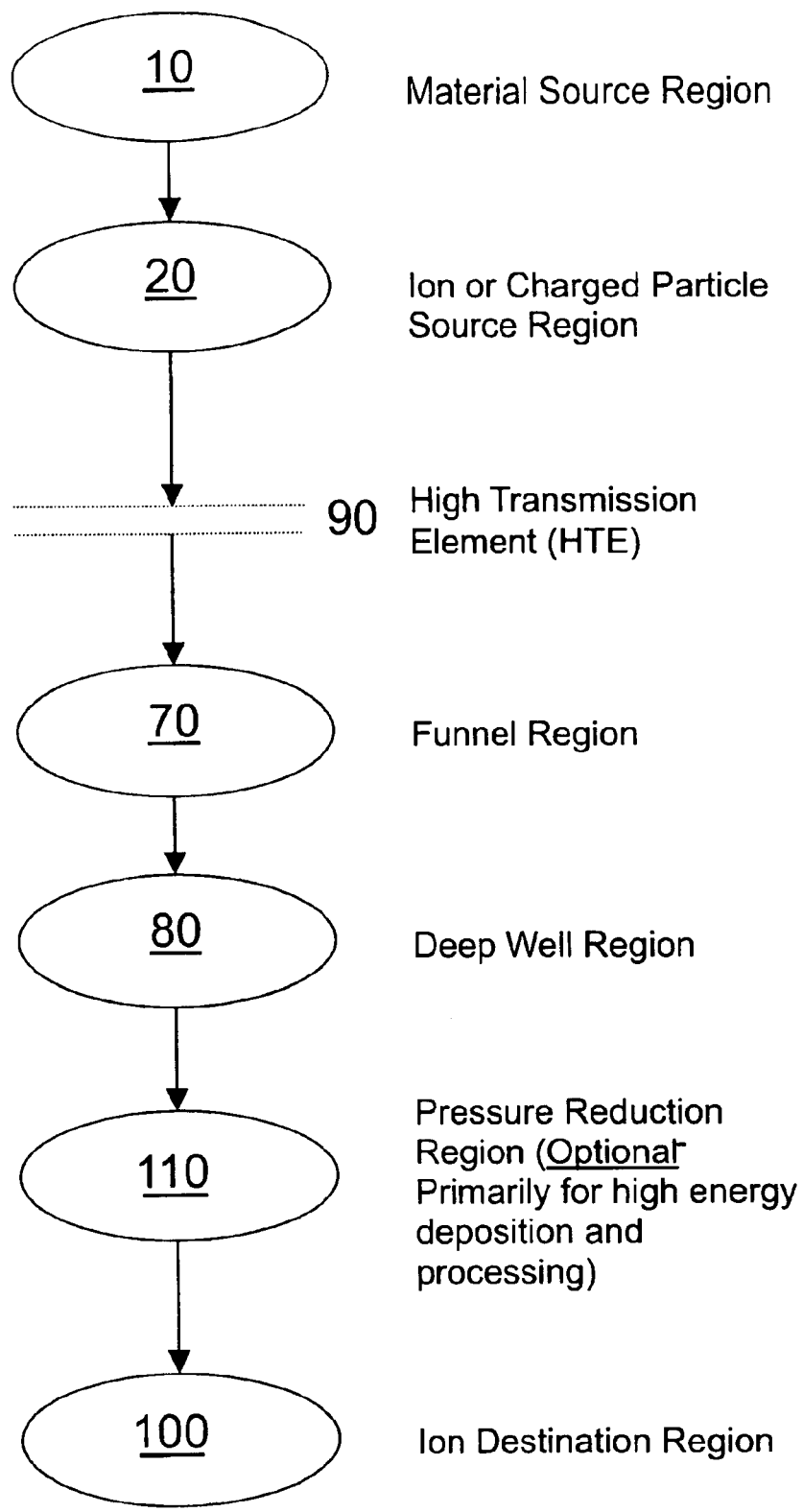
FIG. 3 shows an illustration of the operating regions of the current invention and the processes associated with each for atmospheric pressure ion or particle generation with high vacuum deposition (generally high or mixed energy deposition).

FIGS. 3 and 9—Alternative Embodiments [Vacuum Deposition]

The device illustrated in FIGS. 3 and 9 have the same components as those described in FIGS. 2 and 4 except that the beam of ions or charged particles are not directed onto a surface at atmospheric pressure, rather, they are directed through a restrictor aperture or tube into a reduced pressure region. The beam is deposited onto surfaces that are typically held at high vacuum. Under high vacuum conditions, ions can be accelerated to very high deposition energies and focused with a wide variety of conventional low-pressure optics.

Operation—FIG. 4

The HTE 90 in operation is placed between the ion source and the ion destination to isolate the processes of ion generation from ion collection, analysis, or detection without significant transmission losses. The potentials of the electrodes 92 and 96 are adjusted to control transmission. Ions supplied or generated from an atmospheric pressure (or near atmospheric pressure) source are attracted to the HTE 90 by an electrical potential difference between the ion source region 20 and the potential on inner-electrode 92 of the HTE 90. The ions will tend to follow the field lines through region 60. We distinguish regions 20 and 60 in that the ion source region 20 may comprise a plasma with ill-defined or uncontrollable fields. Region 60 contains gas such as air or nitrogen below the threshold for discharge ionization and fields defined by the shape and potential on HTE 90. The ions moving toward inner-electrode 92 are diverted away from the conducting surfaces of the inner-electrode through the openings 98 by the presence of the electrical field penetrating through the openings into the part of region 60 that is close to the inner-electrode 92. This field penetration is due to the potential difference between the inner-92 and the outer-electrode 96 being relatively high. As the ions move into the openings, they are compressed toward the axis of openings 98. FIG. 1A illustrates the motion of ions through the HTE 90 when the fields on either side of the HTE are equal and transmission is virtually 100%. When the field on the ion source region 60 side is substantially higher than the field in the ion funnel region 70 side, many ions impact on the surface of the outer-electrode 96 (back-deposition). To overcome transmission losses due to this unfavorable field ratio, a concurrent flow of gas can be added to prevent back-deposition and thus maximize transmission of ions through the HTE into the ion funnel region.

The device illustrated in FIGS. 4A and B operates by generating ions or collecting ions in the ion source region 60. The ions are accelerated away from the ion source region, toward and through the HTE 90 into the funnel region 70 of the device where ions are focused through the funnel aperture into the deep-well region where a well-collimated and highly compressed beam of ions is delivered to the ion destination region 100. FIG. 4C displays the potential-energy surface plot showing the relative potential of each component of the operating system. In general, the ions flow form a dispersive, high-field source region, across the HTE 90 with local high-fields to nudge the ion through the openings and through the HTE, into and through the funnel-shaped focusing fields of the funnel region 70, and into the deep potential well of the deep-well region 80. The general operation is simply to isolate the focusing regions 70 and 80 from the dispersive ion source region 60 in order to maximize compression and collection while minimizing transmission losses.

The ion destination region 100 for the present device is a surface upon which the ions will be deposited. Drawing occurs on the present device by moving the ion beam relative to the target surface as shown in FIG. 5. It is critical for precise spatial control over the deposition process that the surfaces are held at appropriate electric potentials as to allow the application of the beam material onto the directed location on the target surface. The target surface must be held at or near the electrical potential of the ion destination wall.

In general, ion drawing mode delivers a beam of ions or charged particles of a relatively uniform and determinable cross-section. The beam is deposited onto the surface at dimensions that are associated with the beam optics and density of the beam. The amount of material deposited onto the surface is determined by the beam density and can be controlled through material concentration in sample solutions for liquid introduction, or alternatively through material partial pressures for gas introduction and any of a wide variety of accepted methods for quantitative delivery of material from material sources.

In the ion-drawing mode, we envision that the beam will be started and stopped by a variety of beam switching operating modes. One method to stop the beam is to bias the ion motion away from the funnel/well by placing an attractive voltage on source wall opposite the HTE. Alternatively, the second laminate in a laminated HTE can be held at a higher potential than the first resulting in a retarding potential at the HTE to present transmission of ions across the HTE. We also envision that mechanical shutters could be used as well to stop the beam from being applied to the target surface.

An alternative method to control the beam diameter of the ion beam incorporates a mechanical iris to allow adjustment of the funnel aperture diameter during or between deposition steps. This adjustable iris is controllable through remote electromechanical and/or computer control.

All manipulations of the ion beam relative to the target surface are capable of high speed and synchronous control, typically through computer sequencing.

Operation of the Ion Printing Device—FIGS. 7 and 8

In one mode of operation, a patterned HTE 90 is placed between the ion source and the ion destination to isolate the processes of ion generation from ion collection in order to control the specific geometry of the ion beam that is deposited onto the target surface. In this mode of operation, the efficiency of ion transmission is diminished to accomplish a predefined and higher precision pattern than that obtained from the ion drawing mode. (Some of the ions are lost onto the surface of the pattern.) Ions supplied or generated from an atmospheric pressure (or near atmospheric pressure) source are attracted to the patterned HTE 90 by an electrical potential difference between the ion source region 20 and the potential on inner-electrode 92 of the HTE 90. The ions moving toward inner-electrode 92 are diverted away from the conducting surfaces of the inner-electrode through the openings 98 by the presence of the electrical field penetrating through the openings into the part of region 60 that is close to the inner-electrode 92. This field penetration is due to the potential difference between the inner-92 and the outer-electrode 96 being relatively high. As the ions move into the openings, they are compressed toward the axis of openings 98. With the ion-printing mode of operation, a pattern of openings through which ions can transmit can be incorporated in to either inner electrode 92 or outer electrode 96, or both. If both have patterns, the patterns will generally match. It should also be mentioned that a single electrode HTE consisting of a predefined pattern can also be used.

In the ion printing mode, the ions are accelerated away from the ion source region, toward and through the patterned HTE 90 into the funnel region 70 of the device where ions are focused through the funnel aperture into the deep-well region where a well-collimated and highly compressed "patterned" beam of ions is delivered to the ion destination region 100. In general, the ions flow form a dispersive, high-field source region, across the HTE 90 with local high-fields to nudge the ion through the openings and through the patterned HTE, into and through the funnel-shaped focusing fields of the funnel region 70, and into the deep potential well of the deep-well region 80. The 2-dimensional pattern on the HTE surface is radially compressed in the funnel-well and deposited onto the target surface.

An alternative method of creating a predetermined pattern of ions is described in our copending U.S. patent application U.S. Ser. No. 10/449,147. The pattern of ion is controlled by selectively determining the transmission across each aperture in a surface array of laminated apertures. A "bit-mapped" pattern can be transmitted giving control of pattern in both time and space to the resolution of the array.

A second alternative method for creating a predetermined pattern of ions would be to insert a patterned thin planar electrode into the deep well region of the funnel/well (coplanar to the equipotential surfaces in the deep well). This beam masking would facilitate masking with a linear mask (e.g. The pattern on the mask would have a linear relationship to the pattern on the target surface).

FIG. 8 illustrates the compression of a array of droplets from a pulsed source. In this method example, droplets from ink jet arrays are compressed in the funnel-well optics to a much smaller cross-section than the head array dimensions. This method is intended for compression of time and space varying sources of charged droplets and ions onto a surface much smaller than the generation source dimension. (e.g. Ink jet generated droplets can be optically compressed and evaporated to facilitate micro-printing.)

The flow of gas in a direction that is counter to the movement of ions will serve to reduce or eliminate contamination from unwanted particulate materials and neutral (possibly reactive) gases. Operating with a counter-flow of gas is accomplished by adding sufficient flow to purge or remove unwanted materials. This to some extent will have some dependency on the volatility of neutral gases and the size of interfering particulate material originating from the ion source region 60. Lower mobility charged particles may also be swept away in the counter-flow of gas. In some cases, a combination of gas following concurrent to the motion of ions to improve transmission through the HTE and gas flowing counter-current to remove impurities may be required. When using gas flowing in opposite directions the counter-flow of gas is likely to occur through the funnel aperture 76.

Operation of the of Multiple Source Devices

The operation of the present invention can accommodate the collection of ions from more than one source. This multi-source device operates under the same principles as a single-source device but the ion source region 60 is occupied by more than one ion source. In some applications, each source of material and ions may also require a separate mask or pattern to be deposited onto the target surface. Under these operating conditions, multiple materials can be deposited onto a single target surface in material-specific patterns. The target surface can be uniquely built up with control of material deposition in both 2-dimensions and 3-dimensions.

Operation of the of Multiple Collector or Target Devices

This invention may also operate in a mode whereby the ions from a single ion source region 60 are collected and focused across multiple HTE with multiple discrete collection regions. This mode is useful for delivering ions from a single source to multiple focal points or apertures for sampling and eventual analysis or delivering to multiple targets. A single ion source with two or more HTE and companion targets up to a large array of HTE and target foci can have application in a wide variety of areas including loading reagents onto reaction wells, printing, micro-fabrication, semi-conductor manufacturing, etc.

Operation of the of Vacuum Target Devices

This invention may also operate in a mode whereby the ions and charged particles are directed at a tube or aperture separating the atmospheric pressure source and optics from a low-pressure target surface. The transmission of the beams into high vacuum (generally less than 10–5 Torr) will allow the ions and particles to be accelerated to high kinetic energies for processes such as doping and etching. The transmission efficiency of the current device and the unique and beneficial properties for some applications of generating ions and charged particles at atmospheric pressure and above, make the current device a desirable alternative to low pressure ion and particle generation sources.

Comments

Unlike graphical items and inks where film quality may contain minor defects in coverage (and the eye compensates for the discontinuities), electronic films or other functional devices cannot tolerate breaks within the thin film deposits without significantly affecting device characteristics and performance, therefore, high efficient ion lens elements are required for ion printing operation. The processor as described above is similar to xerographic production but is unique and different in that the processor does not rely on a photoconductive semiconductive surface nor on ink/toner carrier balls that is commonly used in xerographic copying and reproduction. However, the processor MAY be combined with a semiconductive surface to create charged distribution patterns that can be followed by powder/toner dusting and pattern transfer creating a direct xerographic like device.

In addition, the printer can be scaled up into arrays of lens arrays yielding a large area patterning processor for large devices fabrication or for parallel device creation.

The printer has direct application (but not limited to) printed electronics and printed devices such as printed RFID tags, electronic labels, electronic packaging, electronic tickets, electronic paper, sensor cards, biological sensors, solar cells, and organic electronics (such as O-FETs and O-LEDs). The printer provides a low cost, non-vacuum, non-solution processable, materials deposition capability and manufacturing method for inorganic, organic, biomolecular and surface activated thin films. The system permits the creation of 2D and 3D nano-, micro-, and macro-structures of varying composition (when combined with multiple feed stocks) permitting matter based devices of limitless shapes and sizes and of heterogeneous composition.

Conclusion, Ramifications, and Scope

Although the description above contains many specifications, these should not be construed as limiting the scope of the invention but as merely providing illustrations of some of the presently preferred embodiments of this invention. For example the complex shapes and patterns, insulator surfaces can be manufactured by using the techniques of microelectronics fabrication, photolithography for creating patterns, etching for removing material, and deposition for coating the base with specific materials; the laminated high-transmission element can have other shapes, such as, convex or concave; the number of laminates, the size and shape of openings in the laminated high-transmission element can vary depending on the source of ions, the type of ion-collection region or a combination of both, the dimensions of the ion control spans the continuum and the descriptions above apply at the nano,micro/macro scale for creating 2-dimensional and 3-dimensional shapes of complex heterogeneous nature.

Thus the scope of the invention should be determined by the appended claims and their legal equivalents, rather than by the examples given.

We claim:

1. An ion or charged particle transmission device at or near atmospheric pressure for delivery of charged material to a deposition or reaction surface, said device comprising;
    a) a near atmospheric pressure ion or charged particle source,
    b) a high transmission electrode surface that controls the passage efficiency and spatial distribution of said charged material through said surface and into an ion beam creation optics region,
    c) optics in said ion beam creation region with associated power supplies to generate a collimated beam of charged material,
    d) a material collection surface held at or near atmospheric pressure at a lower electrical potential than said ion source and said high transmission electrode to enable attraction and deposition to said collection surface;
    whereby, the delivery of said charged material from said source has precisely controlled spatial distribution, temporal deposition, composition, and energy.

2. A device as described in claim 1 wherein said high transmission electrode further comprises a 3-dimensional conformal mask for atmospheric pressure high-resolution patterns.

3. A device as described in claim 1 wherein said high transmission electrode further comprises a 2-dimensional or a 3-dimensional shadow mask for highly efficient atmospheric ion pattern printing.

4. A device as described in claim 1 wherein said high transmission electrode further comprises a selectable lenses dispersed within the surface of said high transmission element for maskless ion pattern printing.

5. A device as described in claim 4 wherein said selectable lenses further comprises variable elements to control the density and concentration of said charged material delivered to said material collection surface providing gray-scaling capabilities.

6. A device as described in claim 1 further comprises a computer or controller to provide spatial and electric potential control of said ion source, high transmission element, optics, material collection surface or combination thereof.

7. A device as described in claim 1 wherein said material collection surface further comprises a non-photoconductive semiconductive surface for collection of said charged material.

8. A device as described in claim 1 wherein said ion source further comprises an atmospheric ion or particle printer that deposits specific inorganic, organic, biomolecular, or cellular materials onto the said collection surface.

9. A device as described in claim 1 wherein said ion source further comprises a heterogeneous matter printer for 2-dimensional and 3-dimensional matter forms creation.

10. An ion or charged particle transmission device for delivery of charged material to a deposition or reaction surface at reduced pressures, said device comprising;
    a) a near atmospheric pressure ion or charged particle source,
    b) a high transmission electrode surface at or near atmospheric pressure that controls the efficiency of passage and spatial distribution of said charged material through said surface into a beam creation optics region,
    c) beam creation optics in said beam creation optics region at or near atmospheric pressure to generate a collimated beam of said charged material,
    d) a conductance aperture or tube, or an array of apertures and tubes, to enable transmission of said charged material from said ion source into a lower pressure deposition region,
    e) one or more stages of pressure reduction with ion optics, ion guides, or a combination thereof to transfer said charge material into said lower pressure region;
    f) ion beam control optics in said lower pressure region downstream of said pressure reduction,
    g) a positionally static or movable material collection surface in said lower pressure regions downstream of said low pressure ion beam control optics said collection surface at a lower electrical potential than said low pressure optics to enable attraction and deposition of said charged material to said collection surface;
    whereby, the delivery of said charged material from said source is precisely controlled in terms of spatial distribution, temporal disposition, composition, and energy.

11. A device as described in claim 10 wherein said high transmission element further comprises a 2-dimensional or 3-dimensional shadow mask for highly efficient atmospheric ion pattern printing.

12. A device as described in claim 10 wherein said high transmission element comprises a selectable digital ion lens dispersed within, on the surface or a combination thereof of said high transmission element for maskless ion pattern printing.

13. A device as described in claim 10 wherein said high transmission surface further comprises a variable lens dispersed within or on the surface of said high transmission element to control the density and concentration of material delivered to said material collection surface to provide gray-scale intensity capabilities.

14. A device as described in claim 10 wherein said material collection surface further comprises a non-photoconductive semiconductive surface for collection of said charged material.

15. A device as described in claim 10 wherein said ion source further comprises an atmospheric ion or particle printer that deposits specific inorganic, organic, biomolecular, or cellular materials onto the said collection surface.

16. A device as described in claim 10 wherein said ion source further comprises a heterogeneous matter printer for 2-dimensional and 3-dimensional matter forms creation.

17. A device as described in claim 10 further comprises computer control of electric potentials and spatial orientation of said ion source, high transmission electrode surface, beam reaction optics, conductive aperture or tube, pressure reduction and lower pressure optics, material collection surface, or combinations thereof providing nano-, micro-, and macro-printing capacities.

18. A device as described in claim 10 wherein said beam creation optics further comprises funnel-well optics supplied with DC electrostatic potentials to generate a collimated beam of said charged material.

19. An ion or charged particle transmission device at or near atmospheric pressure for delivery of charged material to a deposition or reaction surface, said device comprising;
   a) a near atmospheric pressure ion or charged particle source,
   b) a high transmission electrode surface at that controls the passage efficiency and spatial distribution of said charged material through said surface and into a funnel-well region,
   c) funnel-well optics with associated power supplies in funnel-well region to generate a collimated ion beam of said charged material,
   d) a positionally static or movable material collection surface held at a lower electrical potential than said ion source enabling attraction and deposition of said charged material onto said collection surface;
   whereby, the delivery of said charged material from said source has precisely controlled spatial distribution, temporal deposition, composition, and energy.

20. A device as described in claim 19 wherein said high transmission element further comprises a 3-dimensional conformal mask for atmospheric pressure high-resolution patterns.

21. A device as described in claim 19 wherein said high transmission element further comprises a 2-dimensional or 3-dimensional shadow mask for highly efficient atmospheric ion pattern printing.

22. A device as described in claim 19 wherein said high transmission electrode further comprises selectable variable lenses dispersed within the surface of said high transmission element for maskless ion pattern printing.

23. A device as described in claim 19 wherein further comprises a computer to control electrical potentials and spatial orientation of said ion source, high transmission electrode, beam creation optics, reduced pressure optics, or combinations thereof to control the density and concentration of said charged material delivered deposited on said material collection surface.

24. A device as described in claim 19 wherein said material collection surface further comprises a non-photoconductive semiconductive surface for collection of charged material.

25. A device as described in claim 19 wherein said ion source further comprises an atmospheric ion or particle printer that deposits specific inorganic, organic, biomolecular, or cellular materials onto the said collection surface.

26. A device as described in claim 19 wherein said ion source further comprises a heterogeneous matter printer for 2-dimensional and 3-dimensional matter forms creation.

27. A method of delivering charged material, such as ions or charged particles to a deposition or reaction surface at or near atmospheric pressure, said method comprising;
   a) generating ions or charged particles in a charged material source;
   b) transmitting said charged material through a high transmission surface in order to control composition, spatial distribution, and temporal transmission profile into focusing region;
   c) providing a means of focusing transmitted said charged material once said material pass through said high transmission surface;
   d) providing a means of collimating focused charged material into precisely defined beams,
   e) depositing and reacting said charged material on a positionally static or movable deposition surface;
   whereby, the delivery of said charged material from said source has precisely controlled spatial distribution, temporal deposition, composition, and energy.

28. A method as described in claim 27 wherein said high transmission surface is further comprises a 2-dimensional, 3-dimensional shadow mask, or a combination thereof, to provide highly efficient atmospheric ion pattern printing.

29. A method as described in claim 27 wherein said high transmission surface is further comprises of a selectable digital ion lens dispersed within said high transmission surface to provide maskless ion pattern printing.

30. A method as described in claim 27 wherein said high transmission surface, is further comprises of a selectable variable ion lens dispersed within or on top of said high transmission surface to provide to provide gray-scale printing capabilities.

31. A method as described in claim 27 wherein a computer controls the electric potentials of said ion source, said high transmission surface, focusing means, collimating means, deposition surface or combinations thereof, to provide passage of charged material through said high transmission surface for enhanced matter etching, matter deposition, and matter nanolithography.

32. A method a described in claim 27 wherein the material deposited on the said collection surface is further processed by moving the position of the deposited material to a remote location from the ion beam and reacting the material with additional reactants, light, or heat.

33. A method of producing a structure by delivering charged material, such as ions or charged particles to a deposition or reaction surface, said method comprising;
   a) generating ions or charged particles in a charged material source at or near atmospheric pressure;
   b) transmitting said charged material through a high transmission surface at or near atmospheric pressure in order to control composition, spatial distribution, and temporal transmission profile into focusing region;
   c) providing a means at or near atmospheric pressure of focusing transmitted said charged material once said material pass through said high transmission surface;
   d) providing a means at or near atmospheric pressure of collimating focused charged material into precisely defined beams,
   e) depositing and reacting said charged material on a deposition surface;

whereby, the delivery of said charged material from said source has precisely controlled spatial distribution, temporal deposition, composition, and energy resulting in the deposition of said material and the production of said structure.

34. A method as described in claim 33 wherein said structure is formed at greatly reduced pressures by maintaining said deposition surface at reduced pressures by means of a vacuum chamber.

35. A method as described in claim 33 wherein said structure is formed at or near atmospheric pressure by maintaining said deposition surface at or near atmospheric pressure.

36. A method as described in claim 33 wherein said structure is formed by a series of temporally or spatially separated steps in order to achieve the desired spatial and compositional resolution of the said structure.

* * * * *